US012563741B2

(12) United States Patent
Park et al.

(10) Patent No.: US 12,563,741 B2
(45) Date of Patent: Feb. 24, 2026

(54) MAGNETORESISTIVE RANDOM ACCESS MEMORY DEVICES HAVING EFFICIENT UNIT CELL LAYOUTS

(71) Applicant: Samsung Electronics Co., Ltd., Suwon-si (KR)

(72) Inventors: Jongsun Park, Seoul (KR); Yunho Jang, Seoul (KR); Seonggeon Park, Seongnam-si (KR)

(73) Assignees: Samsung Electronics Co., Ltd., Suwon-si (KR); Korea University Research and Business Foundation, Seoul (KR)

( * ) Notice: Subject to any disclaimer, the term of this patent is extended or adjusted under 35 U.S.C. 154(b) by 717 days.

(21) Appl. No.: 17/817,435

(22) Filed: Aug. 4, 2022

(65) Prior Publication Data

US 2023/0134533 A1     May 4, 2023

(30) Foreign Application Priority Data

Oct. 28, 2021    (KR) ........................ 10-2021-0145758

(51) Int. Cl.
*H10B 61/00* (2023.01)
*G11C 11/16* (2006.01)
(Continued)

(52) U.S. Cl.
CPC .......... *H10B 61/22* (2023.02); *G11C 11/1673* (2013.01); *G11C 11/1675* (2013.01);
(Continued)

(58) Field of Classification Search
CPC .............. H10B 61/00; H10B 61/20–22; H10N 52/00–85; H10N 59/00
See application file for complete search history.

(56) References Cited

U.S. PATENT DOCUMENTS 9,542,987 B2   1/2017  Naik et al.
9,830,968 B2   11/2017  Shimomura et al.
(Continued)

FOREIGN PATENT DOCUMENTS

JP        2017059634 A    3/2017
JP        2019033185 A    2/2019
(Continued)

OTHER PUBLICATIONS

Kim et al. "Multilevel Spin-Orbit Torque MRAMs" IEEE Transactions on Electron Devices 62(2):561-568 (Feb. 2015).
(Continued)

*Primary Examiner* — Christine S. Kim
*Assistant Examiner* — Tyler J Wiegand
(74) *Attorney, Agent, or Firm* — Wolf, Greenfield & Sacks, P.C.

(57) ABSTRACT

A semiconductor memory device includes first and second word lines, a bit line, a source line, and a memory cell. The memory cell includes a spin-orbit torque (SOT) pattern having a first end electrically coupled to the source line, a magnetic tunnel junction pattern extending adjacent the SOT pattern, and a read transistor having a first current carrying terminal electrically coupled to a first end of the magnetic tunnel junction pattern, a second current carrying terminal electrically coupled to the bit line, and a gate terminal electrically coupled to the first word line. The memory cell also includes a write transistor having a first current carrying terminal electrically coupled to a second end of the SOT pattern, a second current carrying terminal electrically coupled to the first end of the magnetic tunnel junction pattern, and a gate terminal electrically coupled to the second word line.

15 Claims, 9 Drawing Sheets

(51) Int. Cl.
    *H10N 52/00*         (2023.01)
    *H10N 52/80*         (2023.01)
    *H10N 59/00*         (2023.01)

(52) U.S. Cl.
    CPC ............. *H10B 61/00* (2023.02); *H10N 52/00*
        (2023.02); *H10N 52/80* (2023.02); *H10N*
                                 *59/00* (2023.02)

(56)            References Cited

U.S. PATENT DOCUMENTS

| | | | |
|---|---|---|---|
| 10,103,199 | B2 | 10/2018 | Daibou et al. |
| 10,205,088 | B2 | 2/2019 | Sasaki et al. |
| 10,381,060 | B2 | 8/2019 | Kan et al. |
| 10,693,058 | B2 | 6/2020 | Lee |
| 10,748,592 | B2 | 8/2020 | Alhalabi et al. |
| 10,943,951 | B2 | 3/2021 | Chen et al. |
| 11,004,490 | B2 | 5/2021 | Sakhare et al. |
| 11,101,320 | B2 | 8/2021 | Hatcher et al. |
| 11,514,963 | B2 | 11/2022 | Drouard et al. |
| 11,968,844 | B2 * | 4/2024 | Lee ........................ H10N 52/00 |
| 2018/0151210 | A1 | 5/2018 | Li et al. |
| 2019/0051818 | A1 | 2/2019 | Oikawa et al. |
| 2019/0362765 | A1 | 11/2019 | Park et al. |
| 2020/0350364 | A1 | 11/2020 | Wan et al. |
| 2021/0020695 | A1 | 1/2021 | Bak et al. |
| 2021/0050508 | A1 | 2/2021 | Lee et al. |
| 2021/0074344 | A1 | 3/2021 | Hu et al. |
| 2021/0134339 | A1 | 5/2021 | Song et al. |
| 2021/0134882 | A1 | 5/2021 | Lin et al. |
| 2021/0193206 | A1 | 6/2021 | Hanyu et al. |
| 2022/0367566 | A1 * | 11/2022 | Diaz ...................... H10B 61/20 |
| 2023/0263074 | A1 * | 8/2023 | Song ...................... H10N 52/01 |
| | | | 257/421 |
| 2023/0389439 | A1 * | 11/2023 | Huang ................... H10N 50/10 |

FOREIGN PATENT DOCUMENTS

| | | | |
|---|---|---|---|
| JP | 2019531596 | A | 10/2019 |
| KR | 20200003732 | A | 1/2020 |
| KR | 102079346 | B1 | 4/2020 |
| KR | 20210048393 | A | 5/2021 |
| KR | 20210089076 | A | 7/2021 |

OTHER PUBLICATIONS

Korgaonka et al. "Density Tradeoffs of Non-Volatile Memory as a Replacement for SRAM based Last Level Cache" 2018 ACM/IEEE 45th Annual International Symposium on Computer Architecture (pp. 315-327) (Jun. 2018).

Seo et al. "Area-Efficient SOT-MRAM with a Schottky Diode" IEEE Electron Device Letters 37(8) (Aug. 2016).

Seo et al. "High Performance and Energy-Efficient On-Chip Cache Using Dual Port (1R/1W) Spin-Orbit Torque MRAM" IEEE Journal on Emerging and Selected Topics in Circuits and Systems 6(3) (Sep. 2016).

Seo et al. "High-Density SOT-MRAM Based on Shared Bitline Structure" IEEE Transactions on Very Large Scale Integration (VLSI) Systems 26(8) (Aug. 2018).

Sun et al. "Multi Retention Level STT-RAM Cache Designs with a Dynamic Refresh Scheme" 2011 44th Annual IEEE/Acm International Symposium on Microarchitecture (MICRO) (pp. 329-338) (Dec. 2011).

\* cited by examiner

| Read operation | |
| --- | --- |
| RWL | $V_{WL}$ |
| WWL | VSS |
| BL | $V_R$ |
| SL | VSS |

| Read operation | |
|---|---|
| RWL | $V_{WL}$ |
| WWL | $V_{WL}$ |
| SL | $V_{W1}$ |
| BL | VSS |

| Read operation | |
|---|---|
| RWL | $V_{WL}$ |
| WWL | $V_{WL}$ |
| SL | VSS |
| BL | $V_{W2}$ |

MAGNETORESISTIVE RANDOM ACCESS MEMORY DEVICES HAVING EFFICIENT UNIT CELL LAYOUTS

REFERENCE TO PRIORITY APPLICATION

This U.S. non-provisional patent application claims priority under 35 U.S.C. § 119 to Korean Patent Application No. 10-2021-0145758, filed Oct. 28, 2021, the disclosure of which is hereby incorporated herein by reference.

BACKGROUND

The present disclosure relates to semiconductor memory devices and, more particularly, to highly integrated nonvolatile semiconductor memory devices.

As high-speed and/or low power consumption electronic devices have been demanded, high-speed and/or low-voltage semiconductor memory devices used therein have also been demanded. Magnetic memory devices have been developed as semiconductor memory devices capable of satisfying these demands. These magnetic memory devices may emerge as next-generation semiconductor memory devices because of their high-speed and/or non-volatile characteristics. In addition, as highly integrated and/or low-power magnetic memory devices have been increasingly demanded, various techniques for satisfying these demands have been studied.

SUMMARY

Embodiments of the inventive concepts may provide a semiconductor memory device based on spin-orbit torque materials, which is capable of improving an integration density.

In one embodiment, a semiconductor memory device may include a first word line, a second word line, a bit line, a source line, and a nonvolatile memory cell. The memory cell may include a spin-orbit torque (SOT) pattern having a first end connected to the source line and a second end opposite to the first end, a "nonvolatile" magnetic tunnel junction pattern extending on the SOT pattern, and a read transistor, which has: (i) a current carrying path connected in series between a first end of the magnetic tunnel junction pattern and the bit line, and (ii) a gate electrode connected to the first word line. The memory cell also includes a write transistor having: (i) a current carrying path electrically connected in series between the first end of the magnetic tunnel junction pattern and the second end of the SOT pattern, and (ii) a gate electrode connected to the second word line.

In another embodiment, a semiconductor memory device may include first and second memory cells, with each memory cell including a spin-orbit torque (SOT) pattern, a magnetic tunnel junction pattern, a read transistor, and a write transistor. The read and write transistors may be connected in common to a first end of the magnetic tunnel junction pattern in each of the first and second memory cells, and the read transistors of the first and second memory cells may be connected in common to a bit line.

In still another embodiment, a semiconductor memory device may include a device isolation layer, which at least partially defines an active region in a semiconductor substrate. First and second write word lines are provided, which intersect the active region and extend on the semiconductor substrate. First and second read word lines are provided, which intersect the active region between the first and second write word lines and extend on the semiconductor substrate. A first dopant region is provided in the active region at a side of the first write word line, and a second dopant region is provided in the active region at another side of the second write word line. In addition, a first common dopant region is provided in the semiconductor substrate between the first write word line and the first read word line, and a second common dopant region is provided in the semiconductor substrate between the second write word line and the second read word line. A third common dopant region is also provided in the semiconductor substrate between the first and second read word lines. First and second magnetic tunnel junction patterns are provided, which are connected to the first and second common dopant regions, respectively. First and second spin-orbit torque (SOT) patterns are provided, which extend on the first and second magnetic tunnel junction patterns, respectively. A source line is provided, which intersects the first and second write word lines and the first and second read word lines, and is electrically connected in common to the first and second SOT patterns. A bit line is provided, which intersects the first and second write word lines and the first and second read word lines, and is connected to the third common dopant region.

DETAILED DESCRIPTION

Example embodiments of the inventive concepts will now be described more fully with reference to the accompanying drawings.

Figure 1:
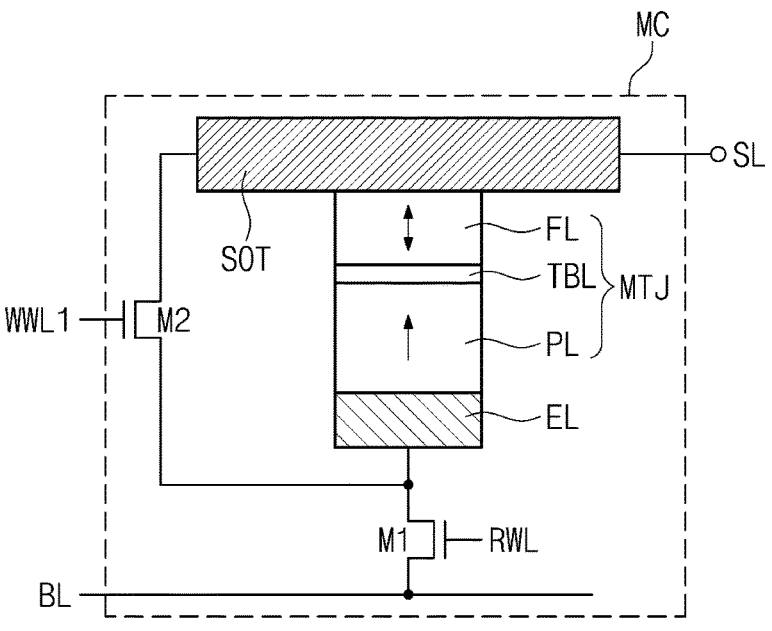
FIG. 1 is a circuit diagram schematically illustrating a memory cell of a semiconductor memory device according to some embodiments of the inventive concepts.

FIG. 1 is a circuit diagram schematically illustrating a memory cell of a semiconductor memory device according to some embodiments of the inventive concepts. Referring to FIG. 1, a memory cell MC of a semiconductor memory device according to some embodiments of the inventive concepts may include a magnetic tunnel junction pattern MTJ, a spin-orbit torque pattern SOT, and first and second transistors M1 and M2, connected as illustrated.

In particular, the magnetic tunnel junction pattern MTJ may extend between the spin-orbit torque pattern SOT and an electrode pattern EL, and may include a pinned magnetic pattern PL, a free magnetic pattern FL, and a tunnel barrier pattern TBL "sandwiched" between the pinned and free magnetic patterns PL and FL. The free magnetic pattern FL may extend between the spin-orbit torque pattern SOT and the tunnel barrier pattern TBL, and the pinned magnetic pattern PL may be spaced apart from the free magnetic pattern FL with the tunnel barrier pattern TBL extending therebetween. As shown, the free magnetic pattern FL may have a first surface and a second surface extending opposite the first surface; the first surface may be in contact with the tunnel barrier pattern TBL, and the second surface may be in contact with the spin-orbit torque pattern SOT.

The free magnetic pattern FL (e.g., "free layer") may have a magnetization direction, which is changeable (e.g., modulated) by the spin-orbit torque pattern SOT; the free magnetic pattern FL may have perpendicular magnetic anisotropy, and may have a single-layered structure or a multi-layered structure. The free magnetic pattern FL may include a magnetic material and may include at least one of, for example, iron (Fe), cobalt (Co), nickel (Ni), boron (B), silicon (Si), platinum (Pt), palladium (Pd), or any alloy thereof.

The free magnetic pattern FL may include at least one of an intrinsic perpendicular magnetic material or an extrinsic perpendicular magnetic material. The intrinsic perpendicular magnetic material may include a material which has a perpendicular magnetization property even though an external factor does not exist. The extrinsic perpendicular magnetic material may include a material which has an intrinsic horizontal magnetization property but has a perpendicular magnetization property by an external factor. For some examples, the free magnetic pattern FL may be a cobalt layer. For other examples, the free magnetic pattern FL may include $Co_{60}Fe_{20}B_{20}$.

The pinned magnetic pattern PL may extend between the electrode pattern EL and the tunnel barrier pattern TBL. The pinned magnetic pattern PL may have a magnetization direction fixed in one direction and may have perpendicular magnetic anisotropy. The pinned magnetic pattern PL may also have a synthetic antiferromagnetic (SAF) structure. In this case, the pinned magnetic pattern PL may include a first pinned pattern, a second pinned pattern, and an exchange coupling pattern extending between the first and second pinned patterns. The first pinned pattern may include a magnetic material, and a magnetization direction of the first pinned pattern may be pinned or fixed by the second pinned pattern. The magnetization direction of the first pinned pattern may be coupled in antiparallel to a magnetization direction of the second pinned pattern by the exchange coupling pattern. For some examples, the pinned magnetic pattern PL may include at least one of Co, Al, Ir, Ru, Pt, Ta, or Hf. For certain examples, the pinned magnetic pattern PL may include at least one of Ni, Fe, Co, B, Ge, Mn, or any alloy of Ni, Fe, Co, B, Ge or Mn. For example, the pinned magnetic pattern PL may include at least one of combinations and mixtures of these materials, such as NiFe, CoFe, or CoFeB. For certain examples, the pinned magnetic pattern PL may include a Co/Pt, Co/Pd or Co/Ni super lattice structure.

The tunnel barrier pattern TBL may include at least one of magnesium oxide, titanium oxide, aluminum oxide, magnesium-zinc oxide, or magnesium-boron oxide, for example. In addition, the electrode pattern EL may be provided between the pinned magnetic pattern PL and the first and second transistors M1 and M2. The electrode pattern EL may include at least one of a metal (e.g., tungsten, titanium, and/or tantalum) or a conductive metal nitride (e.g., titanium nitride, tantalum nitride, and/or tungsten nitride).

The spin-orbit torque pattern SOT may have a first end and a second end opposite to the first end. The first end of the spin-orbit torque pattern SOT may be electrically coupled (e.g., directly connected) to a source line SL, and the second end of the spin-orbit torque pattern SOT may be electrically coupled to a first source/drain electrode/terminal (e.g., first current carrying terminal) of the second transistor M2.

A portion of the spin-orbit torque pattern SOT may be in contact with the free magnetic pattern FL, as shown. The spin-orbit torque pattern SOT may be configured to apply spin-orbit torque to the free magnetic pattern FL of the magnetic tunnel junction pattern MTJ. For example, as will be understood by those skilled in the art, the spin-orbit torque pattern SOT may induce switching of the free magnetic pattern FL by using a spin hall effect (or Rashba effect) when an in-plane current flows through the spin-orbit torque pattern SOT adjacent to the free magnetic pattern FL.

The spin-orbit torque pattern SOT may include, for example, a heavy metal or a material doped with a heavy metal. The spin-orbit torque pattern SOT may include a non-magnetic material. For example, the spin-orbit torque pattern SOT may include at least one of tantalum (Ta), platinum (Pt), bismuth (Bi), titanium (Ti), or tungsten (W).

The first transistor (or read transistor) M1 of the memory cell MC may be electrically connected between the electrode pattern EL (on the magnetic tunnel junction pattern MTJ) and a bit line BL. A gate electrode of the first transistor M1 may be connected to a first word line (or read word line) RWL and may be controlled by the first word line RWL. The bit line BL may be connected to a sense amplifier (not shown). In the sense amplifier, a sensing voltage of the bit line BL may be compared with a reference voltage during a "read" operation to output data stored in the memory cell MC.

In contrast, the second transistor (or write transistor) M2 of the memory cell MC may be electrically connected between the electrode pattern EL (on the magnetic tunnel junction pattern MTJ) and a second end of the spin-orbit torque pattern SOT. A gate electrode of the second transistor M2 may be electrically connected to a second word line (or write word line) WWL and may be controlled by the second word line WWL.

Figure 2:
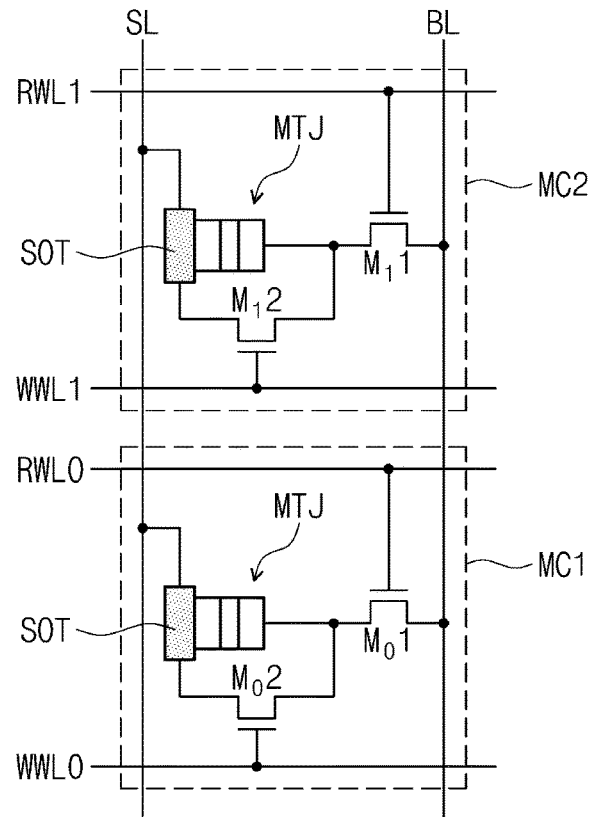
FIG. 2 is a circuit diagram illustrating two memory cells of a semiconductor memory device according to some embodiments of the inventive concepts.

FIG. 2 is a circuit diagram illustrating two memory cells of a semiconductor memory device according to some embodiments of the inventive concepts. In the present embodiments, the descriptions to the same features as mentioned hereinabove will be omitted and differences between the present embodiments and the hereinabove embodiments will be mainly described, for the purpose of ease and convenience in explanation.

Referring to FIG. 2, a semiconductor memory device may include a first memory cell MC1 and a second memory cell MC2, and each of the first and second memory cells MC1 and MC2 may include a spin-orbit torque pattern SOT, a magnetic tunnel junction pattern MTJ, a first transistor $M_o1$ or $M_11$, and a second transistor $M_o2$ or $M_12$, as described hereinabove with reference to FIG. 1.

The first and second memory cells MC1 and MC2 may share a source line SL and a bit line BL. First ends of the spin-orbit torque patterns SOT of the first and second memory cells MC1 and MC2 may be connected in common to the source line SL. The first transistors $M_0 1$ and $M_1 1$ of the first and second memory cells MC1 and MC2 may have respective current carrying terminals (e.g., source/drain electrodes) electrically connected in common to the bit line BL.

Moreover, in each of the first and second memory cells MC1 and MC2, the pair of first and second transistors $M_0 1$ and $M_0 2$ (or $M_1$ and $M_1 2$) may have respective current carrying terminals connected in common to a first end of the magnetic tunnel junction pattern MTJ, and a second end of the spin-orbit torque pattern SOT may be connected to a current carrying terminal (e.g., source/drain electrode) of the second transistor $M_0 2$ or $M_1 2$.

In each of the first and second memory cells MC1 and MC2, the first transistor $M_0 1$ or $M_0 1$ may be connected between the bit line BL and the first end of the magnetic tunnel junction pattern MTJ, and the second transistor $M_0 2$ or $M_1 2$ may be connected between the first end of the magnetic tunnel junction pattern MTJ and the second end of the spin-orbit torque pattern SOT. In addition, the first transistor $M_0 1$ of the first memory cell MC1 may be controlled by a first read word line RWL0, and first transistor $M_1 1$ of the second memory cell MC2 may be controlled by a second read word line RWL1. Finally, the second transistor $M_0 2$ of the first memory cell MC1 may be controlled by a first write word line WWL0, and the second transistor $M_1 2$ of the second memory cell MC2 may be controlled by a second write word line WWL1.

Figure 3:
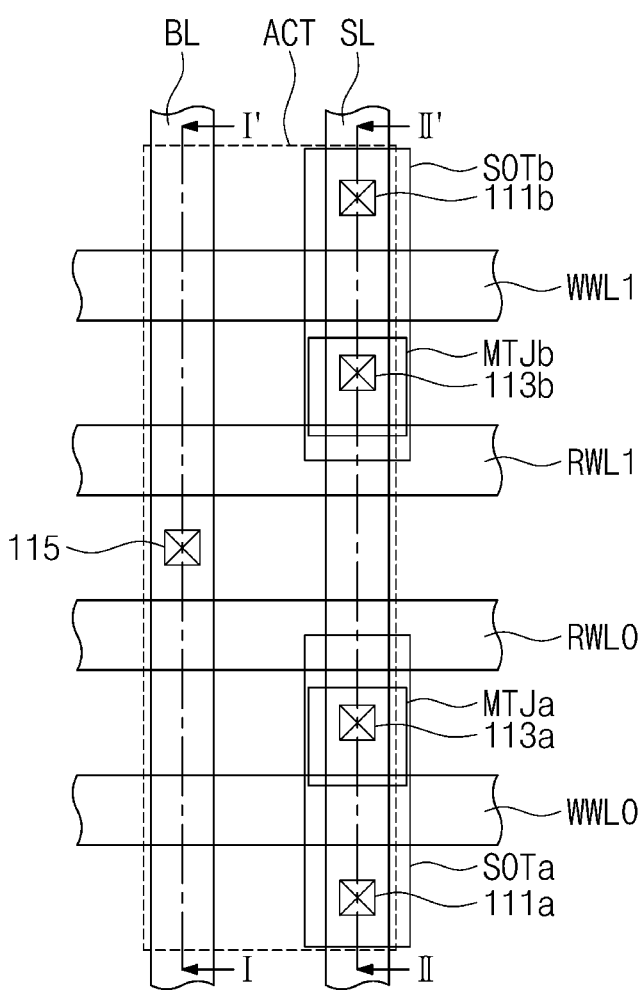
FIG. 3 is a plan view illustrating two memory cells of a semiconductor memory device according to some embodiments of the inventive concepts.
Figure 3:
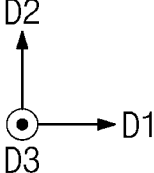
Figure 4:
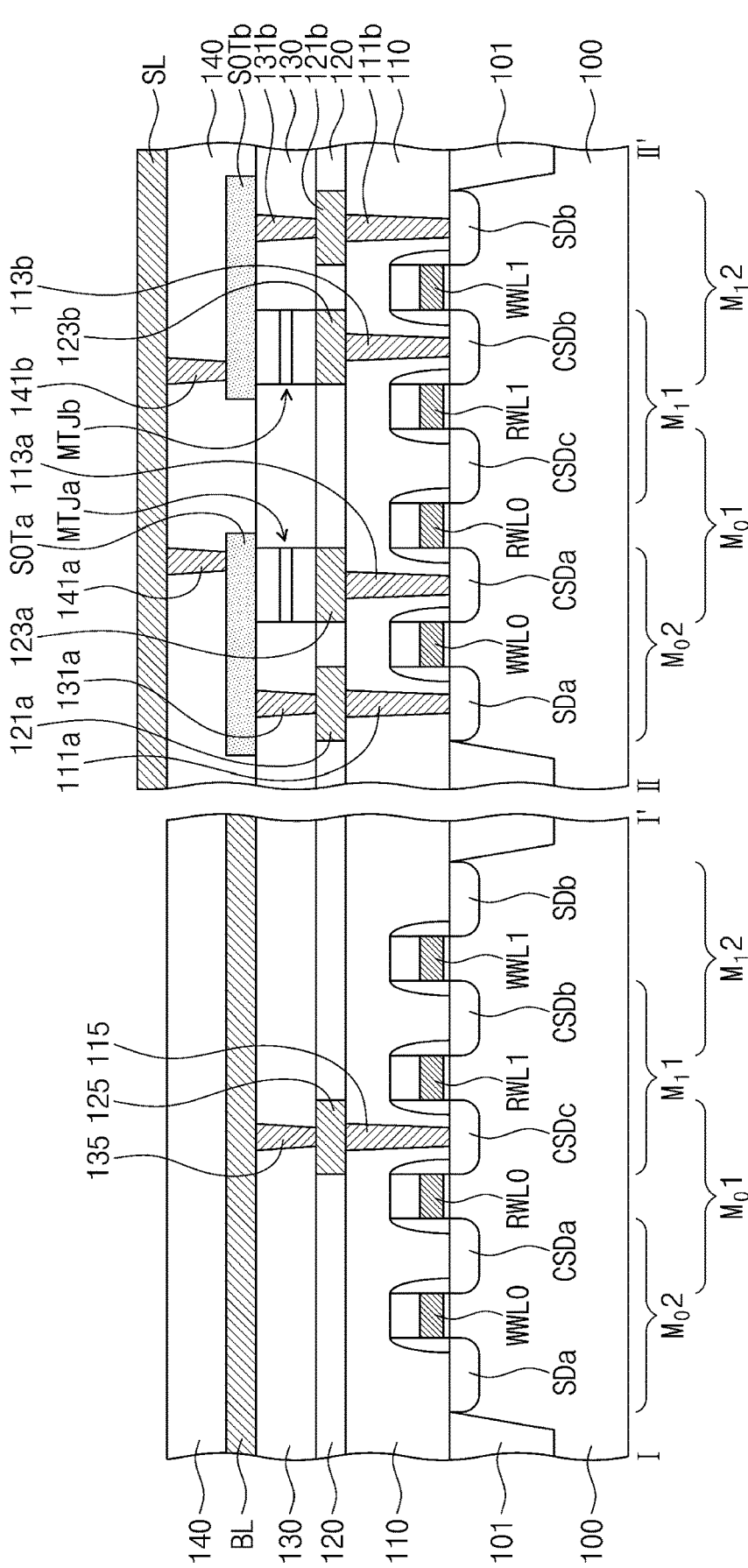
FIG. 4 is a cross-sectional view taken along lines I-I' and II-II' of FIG. 3 to illustrate a semiconductor memory device according to some embodiments of the inventive concepts.
Figure 5:
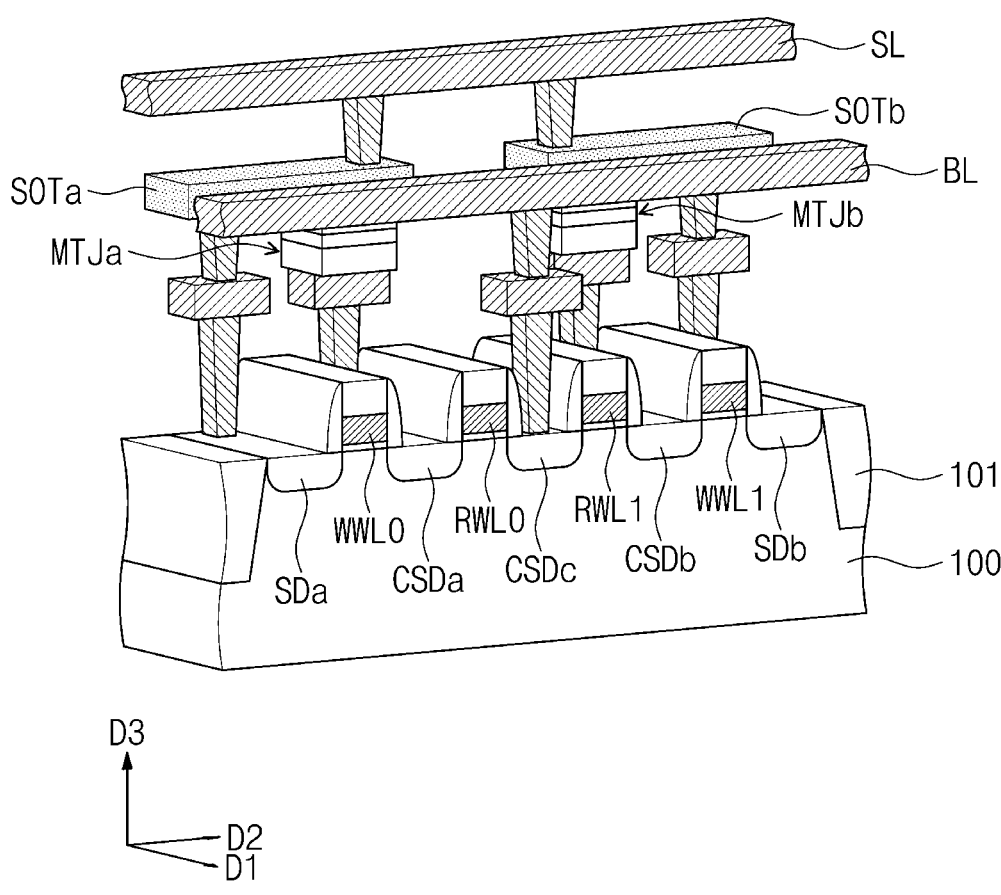
FIG. 5 is a perspective view illustrating a semiconductor memory device according to some embodiments of the inventive concepts.

FIG. 3 is a plan view illustrating two memory cells of a semiconductor memory device according to some embodiments of the inventive concepts, and FIG. 4 is a cross-sectional view taken along lines I-I' and II-II' of FIG. 3 to illustrate a semiconductor memory device according to some embodiments of the inventive concepts. FIG. 5 is a perspective view illustrating a semiconductor memory device according to some embodiments of the inventive concepts.

Referring to FIGS. 3, 4 and 5, a device isolation layer 101 defining an active region ACT may extend in a semiconductor substrate 100. The semiconductor substrate 100 may be a silicon substrate, a germanium substrate, and/or a silicon-germanium substrate.

First and second write word lines WWL0 and WWL1 and first and second read word lines RWL0 and RWL1 may extend on the semiconductor substrate 100. The first and second read word lines RWL0 and RWL1 may extend between the first and second write word lines WWL0 and WWL1, as shown. In addition, the first and second write word lines WWL0 and WWL1 and the first and second read word lines RWL0 and RWL1 may extend in a first direction D1 to intersect the active region ACT and may be spaced apart from each other in a second direction D2.

The first and second write word lines WWL0 and WWL1 and the first and second read word lines RWL0 and RWL1 may extend on the semiconductor substrate 100 with a gate dielectric layer interposed therebetween. The first and second write word lines WWL0 and WWL1 and the first and second read word lines RWL0 and RWL1 may include at least one of a dopant-doped semiconductor material (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

A first dopant region SDa may be provided in the semiconductor substrate 100 at a side of the first write word line WWL0. A second dopant region SDb may be provided in the semiconductor substrate 100 at another side of the second write word line WWL1. A first common dopant region CSDa may be provided in the semiconductor substrate 100 between the first write word line WWL0 and the first read word line RWL0, and a second common dopant region CSDb may be provided in the semiconductor substrate 100 between the second write word line WWL1 and the second read word line RWL1. A third common dopant region CSDc may be provided in the semiconductor substrate 100 between the first and second read word lines RWL0 and RWL1.

The first and second dopant regions SDa and SDb and the first, second and third common dopant regions CSDa, CSDb and CSDc may be doped with dopants having a second conductivity type different from a first conductivity type of the active region ACT. One of the first conductivity type and the second conductivity type may be an N-type, and the other thereof may be a P-type.

In some embodiments, the first and third common dopant regions CSDa and CSDc and the first read word line RWL0 may constitute regions of a first transistor $M_0 1$ of a first memory cell MC1. The first dopant region SDa, the first write word line WWL0 and the first common dopant region CSDa may constitute regions of a second transistor $M_0 2$ of the first memory cell MC1. The second and third common dopant regions CSDb and CSDc and the second read word line RWL1 may constitute regions of a first transistor M11 of a second memory cell MC2. The second dopant region SDb, the second write word line WWL1 and the second common dopant region CSDb may constitute regions of a second transistor M12 of the second memory cell MC2.

In some embodiments, the first and second memory cells MC1 and MC2 may be integrated on a single active region ACT. The first and second memory cells MC1 and MC2 may be mirror-symmetrical with respect to the third common dopant region CSDc.

In some embodiments, the first and second read and write transistors $M_1 1$, $M_1 1$, $M_0 2$ and $M_1 2$ may be planar transistors having channels parallel to a top surface of the semiconductor substrate 100. However, embodiments of the inventive concepts are not limited thereto, and in certain embodiments, the transistors $M_0 1$, $M_0 1$, $M_0 2$ and $M_1 2$ may be buried field effect transistors (FET) having channels buried in the semiconductor substrate 100, fin-type field effect transistor (FinFET), or gate-all-around field effect transistors (GAAFET) in which gate electrodes three-dimensionally surround channels.

A first interlayer insulating layer 110 may extend on an entire top surface of the semiconductor substrate 100. For example, the first interlayer insulating layer 110 may be formed of a nitride (e.g., silicon nitride) and/or an oxynitride (e.g., silicon oxynitride). In addition, a first lower plug 111a may penetrate the first interlayer insulating layer 110 so as to be connected to the first dopant region SDa, and a second lower plug 111b may penetrate the first interlayer insulating layer 110 so as to be connected to the second dopant region SDb.

A third lower plug 113a may penetrate the first interlayer insulating layer 110 so as to be connected to the first common dopant region CSDa, and a fourth lower plug 113b may penetrate the first interlayer insulating layer 110 so as to be connected to the second common dopant region CSDb. A fifth lower plug 115 may penetrate the first interlayer insulating layer 110 so as to be connected to the third common dopant region CSDc.

In some embodiments, the first to fifth lower plugs 111a, 111b, 113a, 113b and 115 may include at least one of a dopant-doped semiconductor material (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide). In some embodiments, ohmic patterns (not shown) may extend between the first to fifth lower plugs 111a, 111b, 113a, 113b and 115 and the dopant regions SDa, SDb, CSDa, CSDb and CSDc, respectively. The ohmic patterns may include a metal-semiconductor compound (e.g., a metal silicide such as cobalt silicide or titanium silicide).

A second interlayer insulating layer 120 may extend on the first interlayer insulating layer 110, and first to fifth conductive patterns 121a, 121b, 123a, 123b and 125 respectively connected to the first to fifth lower plugs 111a, 111b, 113a, 113b and 115 may extend in the second interlayer insulating layer 120.

First and second magnetic tunnel junction patterns MTJa and MTJb may extend on the second interlayer insulating layer 120. The first magnetic tunnel junction pattern MTJa may extend on the third conductive pattern 123a, and the second magnetic tunnel junction pattern MTJb may extend on the fourth conductive pattern 123b.

Each of the first and second magnetic tunnel junction patterns MTJa and MTJb may include a free magnetic pattern, a pinned magnetic pattern, and a tunnel barrier pattern between the free and pinned magnetic patterns, as described hereinabove with reference to FIG. 1.

Each of the first and second magnetic tunnel junction patterns MTJa and MTJb may further include a lower electrode and an upper electrode, and the free magnetic pattern, the pinned magnetic pattern and the tunnel barrier pattern therebetween may extend between the lower electrode and the upper electrode. In some embodiments, the first and second magnetic tunnel junction patterns MTJa and MTJb may have the same stacking structure.

Each of the pinned magnetic patterns of the first and second magnetic tunnel junction patterns MTJa and MTJb may be a pinned layer having a fixed magnetization direction, and each of the free magnetic patterns of the first and second magnetic tunnel junction patterns MTJa and MTJb may be a free layer having a magnetization direction changeable to be parallel or antiparallel to the magnetization direction of the pinned layer.

The first and second magnetic tunnel junction patterns MTJa and MTJb including magnetic materials may be formed by a patterning process. At this time, since the first and second magnetic tunnel junction patterns MTJa and MTJb are arranged in the first and second directions D1 and D2 when viewed in a plan view, a process margin may be improved in the patterning process. In addition, each of the first and second magnetic tunnel junction patterns MTJa and MTJb may have an upper width smaller than a lower width. In this case, each of the first and second magnetic tunnel junction patterns MTJa and MTJb may have a substantially trapezoid vertical section.

A third interlayer insulating layer 130 may extend on the second interlayer insulating layer 120. In some embodiments, the third interlayer insulating layer 130 may fill a space between the first and second magnetic tunnel junction patterns MTJa and MTJb and may cover top surfaces of the first and second magnetic tunnel junction patterns MTJa and MTJb. The third interlayer insulating layer 130 may be formed of an oxide (e.g., silicon oxide), a nitride (e.g., silicon nitride), and/or an oxynitride (e.g., silicon oxynitride).

A first connection contact plug 131a may penetrate the third interlayer insulating layer 130 so as to be connected to the first conductive pattern 121a. A second connection contact plug 131b may penetrate the third interlayer insulating layer 130 so as to be connected to the second conductive pattern 121b. A third connection contact plug 135 may penetrate the third interlayer insulating layer 130 so as to be connected to the fifth conductive pattern 125.

In addition, a bit line BL and first and second spin-orbit torque patterns SOTa and SOTb may extend on the third interlayer insulating layer 130. As shown, the bit line BL may extend in the second direction D2 in parallel to a longitudinal axis direction of the active region ACT. The bit line BL may be connected to the third connection contact plug 135. In other words, the bit line BL may be connected to the third common dopant region CSDc through the third connection contact plug 135, the fifth conductive pattern 125 and the fifth lower plug 115.

The first and second spin-orbit torque patterns SOTa and SOTb may be connected to the first and second magnetic tunnel junction patterns MTJa and MTJb, respectively. The first and second spin-orbit torque patterns SOTa and SOTb may be adjacent to or in contact with the free magnetic patterns of the first and second magnetic tunnel junction patterns MTJa and MTJb, respectively. Each of the first and second spin-orbit torque patterns SOTa and SOTb may have a longitudinal axis in the second direction D2.

The first the spin-orbit torque pattern SOTa may be connected to the first connection contact plug 131a and the first magnetic tunnel junction pattern MTJa. The second spin-orbit torque pattern SOTb may be connected to the second connection contact plug 131b and the second magnetic tunnel junction pattern MTJb. In other words, the first spin-orbit torque pattern SOTa may be in contact with a top surface of the first connection contact plug 131a and a top surface of the first magnetic tunnel junction pattern MTJa. The second spin-orbit torque pattern SOTb may be in contact with a top surface of the second connection contact plug 131b and a top surface of the second magnetic tunnel junction pattern MTJb.

A fourth interlayer insulating layer 140 may extend on the third interlayer insulating layer 130. The fourth interlayer insulating layer 140 may cover the first and second spin-orbit torque patterns SOTa and SOTb and the bit line BL. The fourth interlayer insulating layer 140 may be formed of an oxide (e.g., silicon oxide), a nitride (e.g., silicon nitride), and/or an oxynitride (e.g., silicon oxynitride). The first and second upper plugs 141a and 141b may also penetrate the fourth interlayer insulating layer 140 so as to be connected to the first and second spin-orbit torque patterns SOTa and SOTb, respectively.

A source line SL extending in the second direction D2 may extend on the fourth interlayer insulating layer 140. The source line SL may be connected in common to the first and second upper plugs 141a and 141b. The source line SL may be electrically connected in common to the first and second spin-orbit torque patterns SOTa and SOTb through the first and second upper plugs 141a and 141b.

Figure 6:
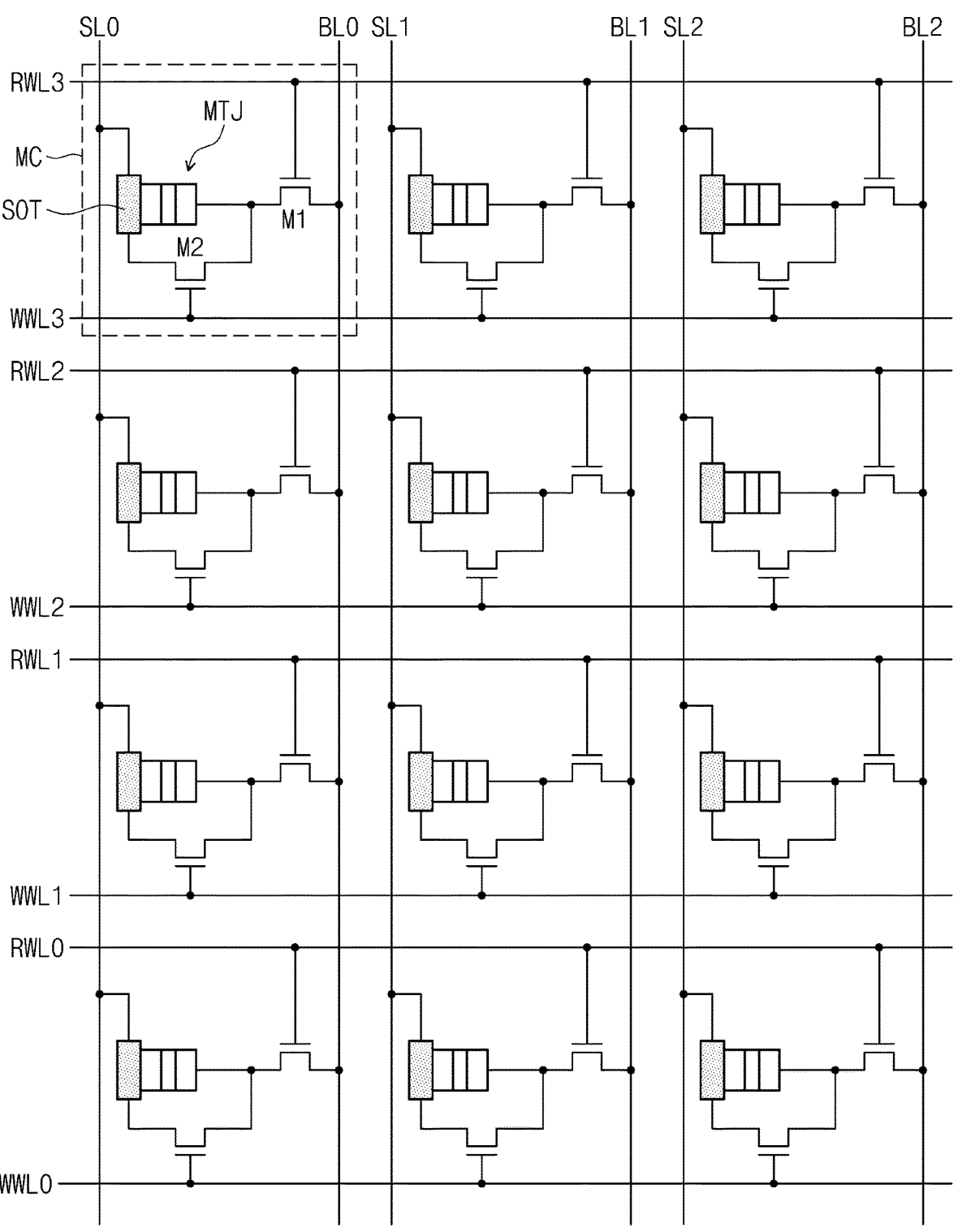
FIG. 6 is a circuit diagram illustrating a cell array of a semiconductor memory device according to some embodiments of the inventive concepts.

FIG. 6 is a circuit diagram illustrating a cell array of a semiconductor memory device according to some embodiments of the inventive concepts. Referring to FIG. 6, a cell array may include a plurality of write word lines WWL0, WWL1, WWL2 and WWL3, a plurality of read word lines RWL0, RWL1, RWL2 and RWL3, a plurality of bit lines BL0, BL1 and BL2, a plurality of source lines SL0, SL1 and SL2, and memory cells MC.

The memory cells MC may be arranged along a plurality of rows and a plurality of columns. The memory cells MC of each row may be connected to a pair of read and write word lines among the read and write word lines RWL0 to RWL3 and WWL0 to WWL3. The memory cells MC of each column may be connected to a pair of source and bit lines among the source and bit lines SL0 to SL2 and BL0 to BL2. Each of the memory cells MC may include the magnetic tunnel junction pattern MTJ, the spin-orbit torque pattern SOT, and the read and write transistors M1 and M2, as described hereinabove with reference to FIG. 1.

The read transistors M1 of the memory cells MC of each row may be connected in common to a corresponding one of the read word lines RWL0 to RWL3, and the write transistors M2 of the memory cells MC of each row may be connected in common to a corresponding one of the write word lines WWL0 to WWL3. The spin-orbit torque patterns SOT of the memory cells MC of each column may be connected in common to a corresponding one of the source lines SL0 to SL2, and the read transistors M1 of the memory cells MC of each column may be connected in common to a corresponding one of the bit lines BL0 to BL2.

Figure 7:
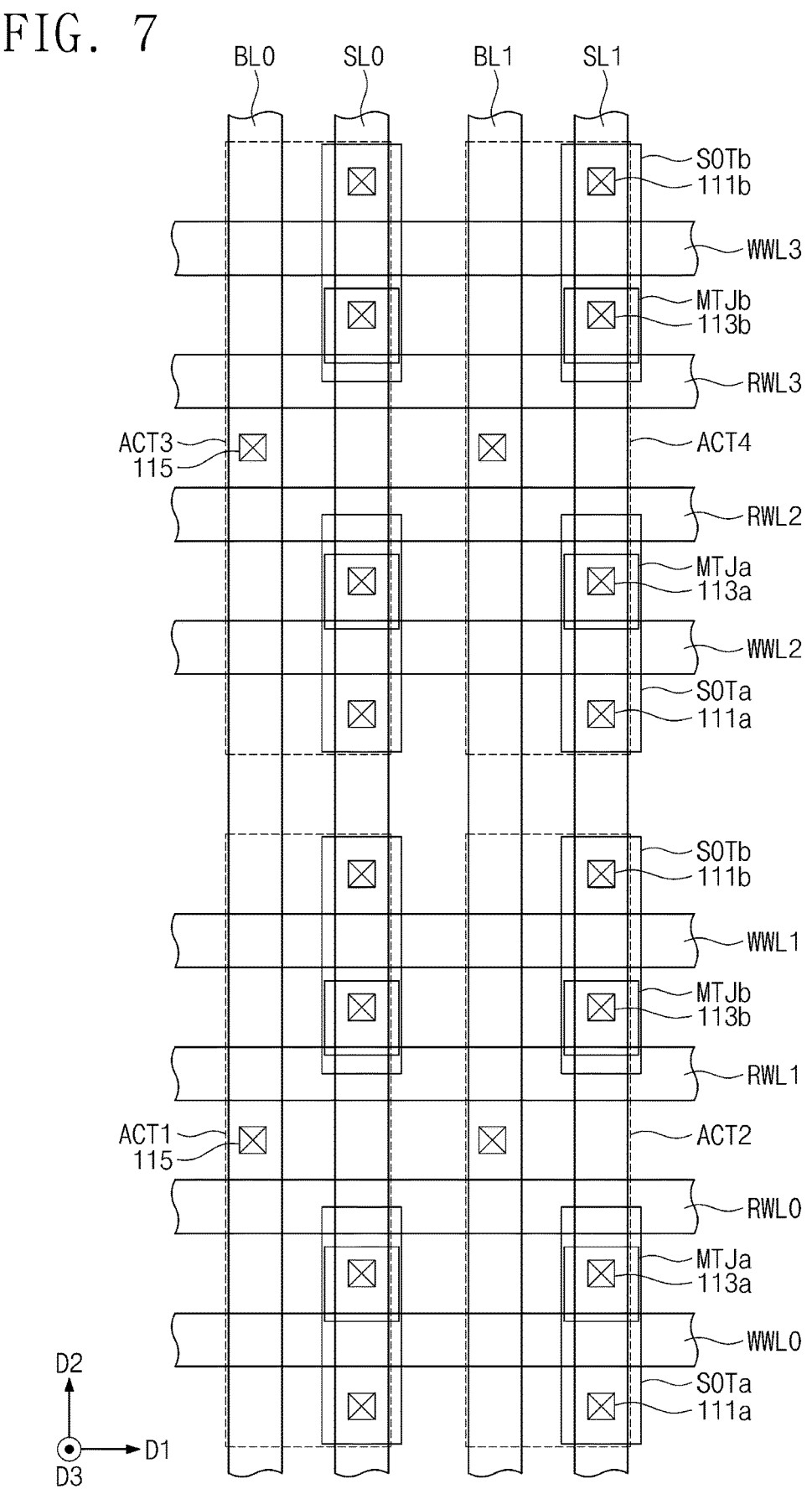
FIG. 7 is a plan view illustrating a cell array of a semiconductor memory device according to some embodiments of the inventive concepts.

FIG. 7 is a plan view illustrating a cell array of a semiconductor memory device according to some embodiments of the inventive concepts. Referring to FIG. 7, a semiconductor substrate 100 may include a plurality of active regions ACT1, ACT2, ACT3 and ACT4 defined by a device isolation layer 101, and the active regions ACT1, ACT2, ACT3 and ACT4 may be arranged in first and second directions D1 and D2 intersecting each other. For example, the semiconductor substrate 100 may include first, second, third and fourth active regions ACT1, ACT2, ACT3 and ACT4, respectively. The first and second active regions ACT1 and ACT2 may be spaced apart from each other in the first direction D1, and the first and third active regions ACT1 and ACT3 may be spaced apart from each other in the second direction D2. The third and fourth active regions ACT3 and ACT4 may be spaced apart from each other in the first direction D1. In some embodiments, two memory cells may be provided on each of the active regions ACT1 to ACT4. In addition, the first and second write word lines WWL0 and WWL1 and first and second read word lines RWL0 and RWL1 may intersect the first and second active regions ACT1 and ACT2, and third and fourth write word lines WWL2 and WWL3 and third and fourth read word lines RWL2 and RWL3 may intersect the third and fourth active regions ACT3 and ACT4.

As described hereinabove with reference to FIGS. 3, 4 and 5, the first and second dopant regions SDa and SDb and the first, second and third common dopant regions CSDa, CSDb and CSDc may be provided in each of the first to fourth active regions ACT1, ACT2, ACT3 and ACT4. First and second magnetic tunnel junction patterns MTJa and MTJb and first and second spin-orbit torque patterns SOTa and SOTb may be provided on each of the first to fourth active regions ACT1, ACT2, ACT3 and ACT4. The first and second magnetic tunnel junction patterns MTJa and MTJb and the first and second spin-orbit torque patterns SOTa and SOTb may be substantially the same as described hereinabove with reference to FIGS. 3, 4 and 5.

A first bit line BL0 and a first source line SL0 may intersect the first and third active regions ACT1 and ACT3, and a second bit line BL1 and a second source line SL1 may intersect the second and fourth active regions ACT2 and ACT4. The first bit line BL0 may be connected in common to the third common dopant regions CSDc of the first and third active regions ACT1 and ACT3, and the second bit line BL1 may be connected in common to the third common dopant regions CSDc of the second and fourth active regions ACT2 and ACT4, as shown.

The first source line SL0 may be connected in common to the first and second spin-orbit torque patterns SOTa and SOTb provided on the first and third active regions ACT1 and ACT3. The second source line SL1 may be connected in common to the first and second spin-orbit torque patterns SOTa and SOTb provided on the second and fourth active regions ACT2 and ACT4.

On each of the first to fourth active regions ACT1, ACT2, ACT3 and ACT4, the first magnetic tunnel junction pattern MTJa and the first spin-orbit torque pattern SOTa and the second magnetic tunnel junction pattern MTJb and the second spin-orbit torque pattern SOTb may be mirror-symmetrical with respect to the third common dopant region CSDc.

Figures 8A, 8B:
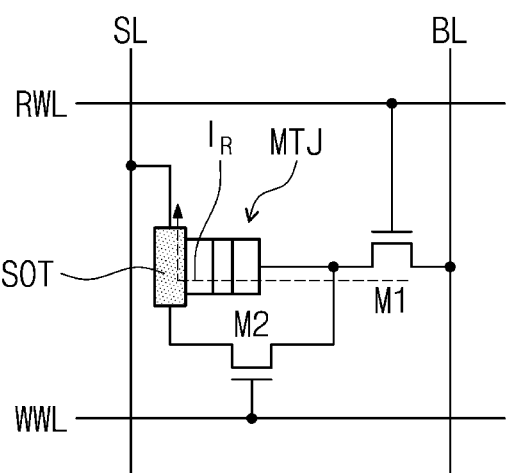
FIGS. 8A and 8B are diagrams for explaining a read operation of a memory cell according to some embodiments of the inventive concepts.

FIGS. 8A and 8B are diagrams for explaining a read operation of a memory cell according to some embodiments of the inventive concepts. Referring to FIGS. 8A and 8B, in a read operation of the memory cell, a read voltage $V_R$ may be applied to a selected bit line BL, and a ground voltage VSS may be applied to the source line SL. Thereafter, a word line voltage $V_{WL}$ may be applied to the read word line RWL to check a resistance state of the magnetic tunnel junction pattern MTJ, and thus the read transistor M1 may be turned-on. The word line voltage $V_{WL}$ may be a voltage greater than a threshold voltage of the read transistor M1. In the read operation, the ground voltage VSS may be applied to the write word line WWL, and thus the write transistor M2 may be turned-off.

In these voltage conditions, a read current $I_R$ may flow from the bit line BL to the source line SL. The read current $I_R$ may flow through a portion of the spin-orbit torque pattern SOT and the magnetic tunnel junction pattern MTJ. The read current $I_R$ may flow through the magnetic tunnel junction pattern MTJ in a direction substantially perpendicular to an interface of the spin-orbit torque pattern SOT and the magnetic tunnel junction pattern MTJ.

The resistance state (e.g., a high resistance state or low resistance state) of the magnetic tunnel junction pattern MTJ may be detected by the read current $I_R$. For example, when the magnetization direction of the free magnetic pattern FL is parallel to the magnetization direction of the pinned magnetic pattern PL, the magnetic tunnel junction pattern MTJ may be in a first resistance state (e.g., a low resistance state) R1. When the magnetization direction of the free magnetic pattern FL is antiparallel to the magnetization direction of the pinned magnetic pattern PL, the magnetic tunnel junction pattern MTJ may be in a second resistance state (e.g., a high resistance state) R2. Data (0 or 1) stored in the magnetic tunnel junction pattern MTJ may be detected depending on the resistance state of the magnetic tunnel junction pattern MTJ.

Figures 9A, 9B:
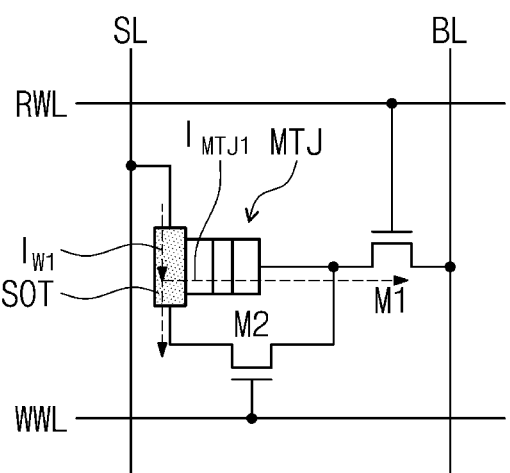
FIGS. 9A and 9B are diagrams for explaining a write operation of a memory cell according to some embodiments of the inventive concepts.

FIGS. 9A and 9B are diagrams for explaining a write operation of a memory cell according to some embodiments of the inventive concepts. Referring to FIGS. 9A and 9B, to write first data (e.g., 0) in the memory cell, the word line voltage $V_{WL}$ may be applied to the read and write word lines RWL and WWL. The read and write transistors M1 and M2 may be turned-on by the applying of the word line voltage $V_{WL}$. A first write voltage $V_{W1}$ may be applied to the source line SL, and the ground voltage VSS may be applied to the bit line BL.

In some embodiments, the read transistor M1 may be turned-on by the word line voltage $V_{WL}$ during the read and write operations. In other words, the read transistor M1 may always be turned-on during the read and write operations. Under these voltage conditions, a first write current $I_{W1}$ may flow from the source line SL to a first source/drain terminal of the write transistor M2 through the spin-orbit torque pattern SOT, and at the same time, a first STT current $I_{MTJ1}$ may flow from the source line SL to the bit line BL through the magnetic tunnel junction pattern MTJ in a direction parallel or antiparallel to the magnetization direction of the pinned magnetic pattern PL of the magnetic tunnel junction pattern MTJ.

The first write current Iwi may be an in-plane current applying spin-orbit torque to the free magnetic pattern FL of the magnetic tunnel junction pattern MTJ. The first write current $I_{W1}$ may flow to be parallel and adjacent to an interface between the spin-orbit torque pattern SOT and the free magnetic pattern FL of the magnetic tunnel junction pattern MTJ. While the first write current $I_{W1}$ flows, a spin current may flow in a direction perpendicular to the interface between the spin-orbit torque pattern SOT and the free magnetic pattern FL of the magnetic tunnel junction pattern MTJ by the spin hall effect and the Rashba effect, and thus the spin-orbit torque may be applied to the magnetic tunnel junction pattern MTJ. The magnetization direction of the free magnetic pattern FL of the magnetic tunnel junction pattern MTJ may be switched to be antiparallel (or parallel) to the magnetization direction of the pinned magnetic pattern PL, on the basis of a magnitude of the first write current $I_{W1}$ induced along a surface of the spin-orbit torque pattern SOT. In the write operation, the first STT current $I_{MTJ1}$ flowing through the magnetic tunnel junction pattern MTJ may produce a spin-transfer-torque (STT) effect, and thus a current required in the write operation may be reduced. Therefore, energy used in the write operation may be reduced.

Figures 10A, 10B:
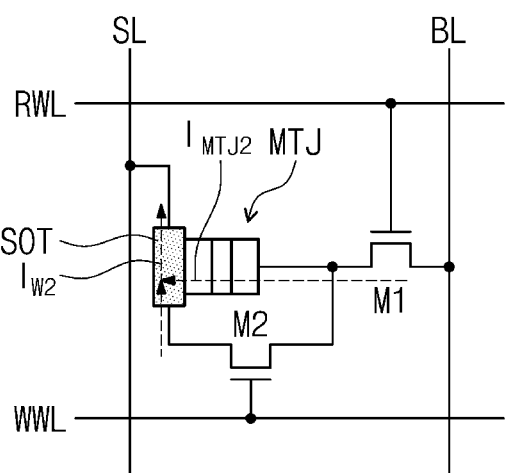
FIGS. 10A and 10B are diagrams for explaining a write operation of a memory cell according to some embodiments of the inventive concepts.

FIGS. 10A and 10B are diagrams for explaining a write operation of a memory cell according to some embodiments of the inventive concepts. Referring to FIGS. 10A and 10B, to write second data (e.g., 1) in the memory cell, the word line voltage $V_{WL}$ may be applied to the read and write word lines RWL and WWL. In addition, the ground voltage VSS may be applied to the source line SL, and a second write voltage $V_{W2}$ may be applied to the bit line BL. Under these voltage conditions, a second write current $I_{W2}$ may flow from the first source/drain terminal of the write transistor M2 to the source line SL through the spin-orbit torque pattern SOT, and at the same time, a second STT current $I_{MTJ2}$ may flow from the bit line BL to the source line SL through the magnetic tunnel junction pattern MTJ. The magnetization direction of the free magnetic pattern FL may be switched to be parallel (or antiparallel) to the magnetization direction of the pinned magnetic pattern PL by spin-orbit torque generated by the second write current $I_{W2}$.

According to the embodiments of the inventive concepts, adjacent two memory cells may be designed to be integrated on a single active region and to share three common dopant regions. Thus, an integration density of the semiconductor memory device may be improved. For example, the write current may be provided through the SOT pattern and the magnetic tunnel junction pattern in the unit memory cell during the write operation of the semiconductor memory device, and thus it is possible to reduce the magnitude of the write current required for switching the magnetization direction of the free magnetic pattern. As a result, write energy in the write operation of the semiconductor memory device may be reduced.

In addition, only one of transistors in each of the unit memory cells may be connected to the bit line, and thus a capacitance of the bit line may be reduced. In other words, since the capacitance of the bit line is reduced, a bit-error-rate (BER) according to a read time (i.e., a developing time of the bit line) may be rapidly improved, and thus read energy may be improved.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor memory device, comprising:
a first memory cell having a first spin-orbit torque (SOT) pattern, a first magnetic tunnel junction pattern, a first read transistor, and a first write transistor therein, said first read transistor having a first current carrying terminal electrically connected to a first current carrying terminal of the first write transistor and to a first end of the first magnetic tunnel junction pattern;
a second memory cell having a second spin-orbit torque (SOT) pattern, a second magnetic tunnel junction pattern, a second read transistor, and a second write transistor therein, said second read transistor having a first current carrying terminal electrically connected to a first current carrying terminal of the second write transistor and to a first end of the second magnetic tunnel junction pattern; and
a bit line electrically connected to a second current carrying terminal of the first read transistor and to a second current carrying terminal of the second read transistor through a common dopant region shared by the first read transistor and the second read transistor.

2. The device of claim 1, further comprising:
a source line electrically connected to a first end of the first SOT pattern and to a first end of the second SOT pattern; and
wherein a second current carrying terminal of the first write transistor is electrically connected to a second end of the first SOT pattern, and a second current carrying terminal of the second write transistor is electrically connected to a second end of the second SOT pattern.

3. The device of claim 1, further comprising:
a first read word line electrically connected to a gate terminal of the first read transistor; and
a second read word line electrically connected to a gate terminal of the second read transistor.

4. The device of claim 3, further comprising:
a first write word line electrically connected to a gate terminal of the first write transistor; and
a second write word line electrically connected to a gate terminal of the second write transistor; and
wherein the first and second read word lines extend between the first and second write word lines, and on an active region.

5. The device of claim 1,
wherein each of the first and second magnetic tunnel junction patterns comprises a pinned magnetic pattern, a free magnetic pattern, and a tunnel barrier pattern extending between the pinned and free magnetic patterns;
wherein the first SOT pattern is in contact with the free magnetic pattern within the first magnetic tunnel junction pattern; and
wherein the second SOT pattern is in contact with the free magnetic pattern within the second magnetic tunnel junction pattern.

6. The device of claim 1, further comprising:

a semiconductor substrate having an active region therein, which is at least partially defined by a device isolation layer; and wherein the first and second memory cells are at least partially integrated within the active region.

7. A semiconductor memory device, comprising:

a device isolation layer, which at least partially defines an active region in a semiconductor substrate;

first and second write word lines overlapping at least a first portion of the active region;

first and second read word lines overlapping at least a second portion of the active region, and extending between the first and second write word lines;

a first dopant region provided in the active region at a side of the first write word line;

a second dopant region provided in the active region at a side of the second write word line;

a first common dopant region provided in the semiconductor substrate and between the first write word line and the first read word line;

a second common dopant region provided in the semiconductor substrate and between the second write word line and the second read word line;

a third common dopant region provided in the semiconductor substrate and shared between the first and second read word lines;

first and second magnetic tunnel junction patterns connected to the first and second common dopant regions, respectively;

first and second spin-orbit torque (SOT) patterns disposed on the first and second magnetic tunnel junction patterns, respectively;

a source line intersecting the first and second write word lines and the first and second read word lines and connected in common to the first and second SOT patterns; and a bit line intersecting the first and second write word lines and the first and second read word lines and connected to the third common dopant region.

8. The device of claim 7, wherein the bit line and the source line are disposed at different heights from the semiconductor substrate.

9. The device of claim 7, wherein the first and second SOT patterns are in contact with top surfaces of the first and second magnetic tunnel junction patterns, respectively.

10. The device of claim 7, wherein each of the first and second magnetic tunnel junction patterns comprises a pinned magnetic pattern, a free magnetic pattern, and a tunnel barrier pattern between the pinned and free magnetic patterns; and wherein the first and second SOT patterns are in contact with the free magnetic patterns of the first and second magnetic tunnel junction patterns, respectively.

11. The device of claim 7, wherein the first and second magnetic tunnel junction patterns are mirror-symmetrical with respect to the third common dopant region when viewed from a plan perspective.

12. The device of claim 7, wherein the first magnetic tunnel junction pattern overlaps with the first common dopant region and the second magnetic tunnel junction pattern overlaps with the second common dopant region, when viewed from a plan perspective.

13. The device of claim 7, wherein each of the first and second SOT patterns has a longitudinal axis in a direction parallel to the bit line and the source line.

14. The device of claim 7, wherein the active region has a longitudinal axis in a direction parallel to the bit line and the source line.

15. The device of claim 7, wherein the first and second SOT patterns include a heavy metal material or a material doped with a heavy metal.

* * * * *